United States Patent [19]

Danstrom

[11] Patent Number: 5,552,746
[45] Date of Patent: Sep. 3, 1996

[54] GATE DRIVE CIRCUIT

[75] Inventor: Eric J. Danstrom, Farmington Hills, Mich.

[73] Assignee: SGS-Thomson Microelectronics, Inc., Carrollton, Tex.

[21] Appl. No.: 418,548

[22] Filed: Apr. 7, 1995

[51] Int. Cl.⁶ .......................... H03K 17/687; H03K 3/00; H03K 5/08
[52] U.S. Cl. .......................... 327/427; 327/108; 327/309; 327/312; 327/314
[58] Field of Search .................. 327/108, 110, 327/309, 312, 427, 432, 434, 314; 361/91

[56] References Cited

U.S. PATENT DOCUMENTS

| | | | |
|---|---|---|---|
| 4,375,074 | 2/1983 | Glogolja | 361/91 |
| 5,140,201 | 8/1992 | Uenishi | 327/427 |
| 5,210,479 | 5/1993 | Kimura et al. | 327/108 |

*Primary Examiner*—David C. Nelms
*Assistant Examiner*—Trong Phan
*Attorney, Agent, or Firm*—Joseph C. Arrambide; Lisa K. Jorgenson

[57] ABSTRACT

A gate drive circuit which has an active voltage clamp is disclosed. The active voltage clamp protects the gate of a power transistor from an electrical over-stress condition. The active voltage clamp includes at least one zener diode connected in series with a current mirror.

22 Claims, 1 Drawing Sheet

GATE DRIVE CIRCUIT

BACKGROUND OF THE INVENTION

Field of the Invention

This invention relates generally to integrated circuits used as FET gate drive circuits, and more particularly to a voltage clamp circuit used to prevent the over-stress of the gate of a MOSFET power transistor.

2. Description of the Relevant Art

The problem addressed by this invention is encountered in circuits which drive the gate of an N-channel power MOSFET transistor which commonly requires a gate voltage greater than a Vcc voltage. FIG. 1, shows a typical prior art circuit for driving a load with a power transistor. In this circuit, the power transistor is an N-channel MOSFET transistor 10. The power transistor is off when the control signal is low since the output of inverter 2 will be high =which consequently turns P-channel transistor 6 off and N-channel transistor 8 on. Thus, the gate of power transistor 10 is pulled to ground through transistor 8 which effectively holds power transistor 10 off. Conversely, the power transistor 10 is turned on when the control signal goes from low to high since the output of inverter 2 is goes from a high to a low which turns transistor 6 on and transistor 8 off. Thus, the gate of power transistor 10 is pulled to a voltage B+ which turns power transistor 10 on. The turn-on time can be described as:

t=c*v/i where t=turn-on time c=the capacitance of the gate v=the gate turn-on voltage, and i=the current flow into the gate.

It has been observed in a typical switching mode power supply application operating at 100 kHz that the t should be less than 20 nanoseconds, the v is on the order of 10 volts, the c is on the order of 1,000 picofarads, and the i is on the order of 500 milliamps. In FIG. 1 as well as generally, the B+ voltage is higher and less regulated than the Vcc voltage. It is common for the B+ voltage to be generated from a battery and its associated charging circuit, from a charge pump circuit, or from other poorly regulated sources. Additionally, it is known in the industry that excessive gate voltage can cause punch through damage to the gate. The maximum safe gate voltage is process dependant and can typically range from 12 to 18 volts for typical BCD process technologies. Therefore, it is desirable to protect the gate of the power transistor from excessive B+ voltages to avoid electrical overstress since the B+ voltage is generally poorly regulated.

FIG. 2 illustrates a gate drive circuit which is the same as the gate drive circuit in FIG. 1, but has an additional zener diode 12 to protect the gate of the power transistor 10 from an excessive B+ voltage. In operations, the power transistor is turned on when the control signal is high and the output of the inverter 2 is low, as described in above. In this state, the gate of transistor 10 is driven to the B+ voltage (minus the Vds voltage drop of transistor 6) which charges the gate and turns the transistor on. Once the transistor is on, the circuit draws a very low current since, after the gate of transistor 10 is charged, transistor 6 only conducts enough current to maintain the charge, which is minimal.

If the voltage on the gate of power transistor 10 exceeds the threshold voltage of the zener diode 12, then zener diode 12 clamps the gate voltage to the threshold voltage. Thus, the gate voltage is limited to the threshold voltage and is protected against any higher voltages by the voltage clamp created by zener diode 12. However, the diode 12 is conducting as much current as is available to Charge the gate of the power transistor, which in the example above was on the order of 500 milliamps. Consequently, the circuit continues to draw a large current on the order of 500 milliamps even after the gate of transistor 10 has been charged.

SUMMARY OF THE INVENTION

Therefore, it is an object of the invention to prevent electrical over-stress of an FET gate.

It is further an object of this invention to minimize the current draw of a clamp circuit used to prevent the electrical over-stress of a FET gate.

These and other objects, features, and advantages of the invention will be apparent to those skilled in the art from the following detailed description of the invention, when read with the drawings and appended claims.

The invention, in summary, is an active voltage clamp used with a gate drive circuit. The active voltage clamp protects the gate of a power transistor from an electrical over-stress condition. The active voltage clamp includes at least one zener diode connected in series with a current mirror which provides feedback to the gate drive circuit.

DETAILED DESCRIPTION OF THE PREFERRED EMBODIMENT

Figure 1:
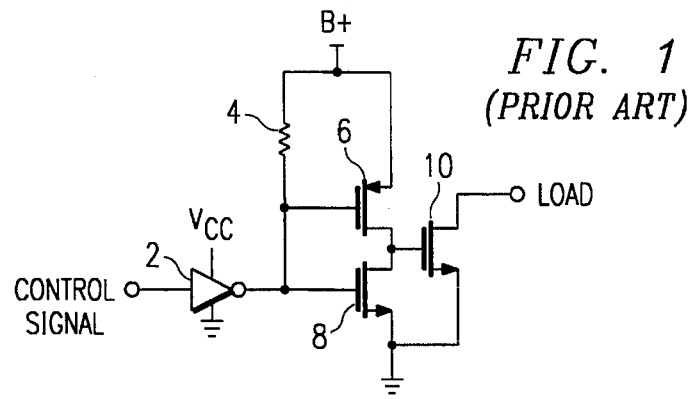
FIG. 1 is a schematic drawing of a gate drive circuit as known in the prior art.
Figure 2:
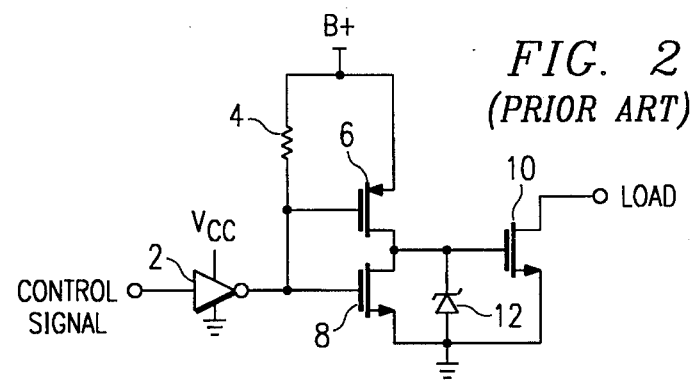
FIG. 2 is a schematic drawing of a gate drive circuit with a voltage clamp as known in the prior art.
Figure 3:
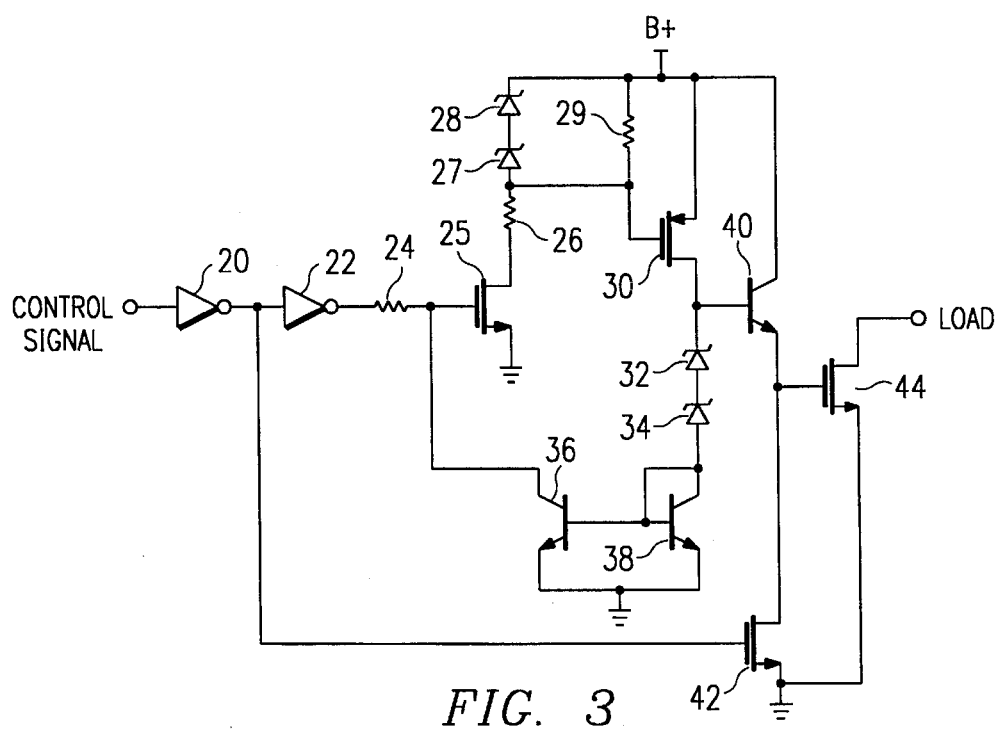
FIG. 3 is a schematic drawing of a gate drive circuit according to the invention.

A gate drive circuit according to the invention will be described. Referring now to FIG. 3, an input stage includes an inverter 20, an inverter 22, and a resistor 24. The inverter 20 has an input for receiving a control signal and an output connected to the input of inverter 22 and to the gate of N-channel MOSFET transistor 42. The output of inverter 22 is connected to a first end of resistor 24. The second end of resistor 24 is connected to the gate of N-channel MOSFET transistor 25 and to the collector of NPN bipolar transistor 36. Zener diode 28 has a cathode connected to a voltage B+ and has an anode connected to the cathode of Zener diode 27. Resistor 29 has a first end connected to B+ and a second end connected to the anode of Zener diode 27, to the first end of resistor 26, and to the gate of P-channel MOSFET transistor 30. The second end of resistor 26 is connected to the drain of transistor 25. The source of transistor 25 is connected to ground. The drain of transistor 30 is connected to the base of NPN bipolar transistor 40 and to the cathode of Zener diode 32. The source of transistor 30 and the collector of transistor 40 are connected to the B+ voltage. The anode of diode 32 is connected to the cathode of Zener diode 34. The anode of diode 34 is connected to the collector and base of NPN bipolar transistor 38 and to the base of transistor 36. The emitters of transistors 36 and 38 are connected to ground. Transistor 36 and 38 are configured as a current mirror. The collector of transistor 40 is connected to voltage B+ and the emitter of transistor 40 is connected to the gate of N-channel power MOSFET transistor 44 and to the drain of transistor 42. The sources of transistors 42 and 44 are connected to ground. The drain of power transistor 44 is connected to a load not shown on the schematic.

In operation, inverter 20, inverter 22, and resistor 24 form the input stage of the gate drive circuit. Transistor 25, resistors 26 and 29, diodes 27 and 28, and transistors 30 and 40 form the high side drive circuit for the power transistor. Transistor 42 forms the low drive circuit. The active voltage clamp is formed by diodes 32 and 34 and transistors 36 and 38.

More specifically, power transistor 44 is controlled responsive to a control signal received by the input stage, inverter 20. When the control signal is low, the output of inverter 20 is at a high voltage which turns on the low drive circuit, transistor 42, thereby pulling the gate of the power transistor 44 to ground. Additionally, the high output on inverter 20 causes a low output on inverter 22 which turns the high side drive circuit off by turning- transistor 25 off, which holds tranisistors 30 and 40 off. Thus, the gate of power transistor 44 is driven to a low voltage and the power transistor is turned off.

If the control signal at the input stage, inverter 20, is high, then the output of inverter 20 is low which turns the low drive circuit, transistor 42 off and the output of inverter 22 high. The high output of inverter 22 turns the high side drive circuit on by turning transistor 25 on, which turns transistor 30 on, and which consequently turns transistor 40 on. Therefore, the gate of transistor 44 is driven through transistor 40 to a voltage level B+ which turns transistor 44 on.

To protect the gate of power transistor 44 from electrical over-stress, an active voltage clamp circuit was invented. The active voltage clamp includes zener diodes 32 and 34 and the current mirror configured with transistors 36 and 38. If the B+voltage is below the threshold voltage ($V_{threshold}$) defined by:

$$V_{threshold} = V_{threshold\ of\ diode\ 32} + V_{threshold\ of\ diode\ 34} + V_{base\text{-}emitter\ of\ transistor\ 38}$$

then the active voltage clamp is passive and does not affect the operation of the circuit. Conversely, the active voltage clamp becomes active when the B+ voltage is at or above the $V_{threshold}$ voltage by conducting current through diodes 32 and 34 and transistor 38. Thus, the high side drive circuit is controlled responsive to an unsafe voltage level on the gate of the power transistor. The current through transistor 38 is mirrored through transistor 36 which is connected to the gate of transistor 25. If the B+ voltage is at a voltage larger than the threshold voltages of diodes 32 and 34, current will begin to flow through diodes 32 and 34 and that current will be mirrored through transistor 36 which would then pull the gate of transistor 25 low. Consequently, the voltage going to the gate of transistor 44 is clamped at the voltage threshold of diodes 32 and 34 plus the voltage drop across transistor 38 minus the base-emitter voltage Vbe of NPN transistor 40. Thus, the mirroring of the current of the voltage regulation diode provides negative feedback so that the voltage to the gate voltage on the of the power transistor is reduced. Additionally, the current flow is limited by the feedback loop established through diodes 32 and 34 and the current mirror generated by transistors 36 and 38. The active voltage clamp is a means for actively lowering the voltage on the gate of the power transistor in response to the voltage on the gate of the power transistor reaching a voltage threshold. Thus, the invention to prevents electrical over-stress of an FET gate for a power transistor such as transistor 44 and minimizes the current draw of a clamp circuit and is, thus, advantageous over the prior art.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A gate drive circuit for driving a gate of a power transistor, the gate drive circuit comprising:

an input stage having an input for receiving a control signal and having an output, a high side drive circuit having an input connected to the output of the input stage, having a sense node, and having an output connected to the gate of the power transistor, a low drive circuit having an input connected to the output of the input stage and having an output connected to the gate of the power transistor, and an active clamp circuit connected between the sense node of the high side drive circuit and the input of the high side drive circuit, for controlling the high side drive circuit responsive to an unsafe voltage level on the gate of the power transistor.

2. The gate drive circuit of claim 1 wherein the active clamp circuit comprises a feedback loop.

3. The gate drive circuit of claim 1 wherein the active clamp circuit comprises at least one voltage-regulation diode in series with a current mirror.

4. The gate drive circuit of claim 3 wherein the at least one voltage regulation diode comprises at least one zener diode.

5. The gate drive circuit of claim 4 wherein the current mirror comprises two bipolar transistors connected in a common emitter configuration.

6. The gate drive circuit of claim 5 wherein the two bipolar transistors are NPN bipolar transistors.

7. A method for driving a gate of a power transistor comprising the steps of:

applying a ground voltage to the gate of the power transistor if a control signal is low, applying a B+ voltage to the gate of the power transistor if a control signal is high, conducting current through a voltage-regulation diode if the voltage on the gate exceeds a voltage threshold, mirroring the current of the voltage-regulation diode such that the mirrored current provides negative feedback so that the voltage to the gate of the power transistor is reduced.

8. The method of claim 7 wherein the step of conducting current through a voltage-regulation diode is performed with at least one zener diode.

9. The method of claim 8 wherein the step of mirroring the current is performed using a current mirror comprised of two transistors configured with the base of the first connected to the base and collector of the second.

10. The method of claim 9 wherein the first and second transistors are NPN transistors.

11. A circuit for driving large loads comprising:

power transistor having a current path between a load and a voltage reference, and having a control element;

an input stage having an input for receiving a control signal and having an output, a high side drive circuit having an input connected to the output of the input stage, having a sense node, and having an output connected to the control element of the power transistor so that the power transistor is on when the input stage receives a high side control signal and off when the input stage receives a low control signal, a low drive circuit having an input connected to the output of the input stage and having an output connected to the control element of the power transistor so that the power transistor is on when the input stage receives a high side control signal and off when the input stage receives a low control signal, and an active clamp circuit connected between the sense node of the high side drive circuit and the input of the high side drive circuit, for controlling the high side drive circuit responsive to an unsafe voltage level on the gate of the power transistor.

12. The gate drive circuit of claim 11 wherein the active clamp circuit comprises a feedback loop.

13. The circuit of claim 12 wherein the active clamp circuit comprises at least one voltage-regulation diode in series with a current mirror.

14. The circuit of claim 13 wherein the at least one voltage regulation diode comprises at least one zener diode.

15. The circuit of claim 13 wherein the current mirror comprises a base of a first transistor connected to a base and a collector of a second transistor.

16. The circuit of claim 15 wherein the first and the second transistors are NPN bipolar transistors.

17. A gate drive circuit for driving a gate of a power transistor, the gate drive circuit comprising:

a means for receiving a control signal and having an output, a means for driving the gate of the power transistor to a high voltage responsive to the control signal, having a sense node and having an output connected to the gate of the power transistor, a means for driving the gate of the power transistor to a low voltage responsive to the control signal, and having an output connected to the gate of the power transistor, and an means for actively lowering the voltage on the gate of the power transistor in response to a voltage on the sense node of the means for driving the gate of the power transistor to a high voltage reaching a voltage threshold, the means of lowering the voltage connected between the gate of the power transistor and the means for driving the gate.

18. The gate drive circuit of claim 17 wherein the means for actively lowering the voltage comprises a feedback loop which.

19. The gate drive circuit of claim 17 wherein the means for actively lowering the voltage comprises at least one voltage regulation diode in series with a current mirror.

20. The gate drive circuit of claim 19 wherein the at least one voltage regulation diode comprises at least one zener diode.

21. The gate drive circuit of claim 20 wherein the current mirror comprises a base of a first transistor connected to a base and a collector of a second transistor.

22. The gate drive circuit of claim 21 wherein the first and the second transistors are NPN bipolar transistors.

* * * * *